United States Patent [19]

Yang et al.

[11] Patent Number: 5,309,036
[45] Date of Patent: May 3, 1994

[54] DRIVER CIRCUIT FOR AN ATTACHMENT UNIT INTERFACE USED IN A NETWORK SYSTEM

[75] Inventors: Tsen-Shau Yang; Wei-Shang Chu, both of Hsinchu City, Taiwan

[73] Assignee: Myson Technology Inc., Hsinchu City, Taiwan

[21] Appl. No.: 68,976

[22] Filed: May 28, 1993

[51] Int. Cl.$^5$ ............................................. H03K 17/16
[52] U.S. Cl. .................................. 307/270; 307/493; 307/246; 307/254; 307/572
[58] Field of Search ............... 307/270, 493, 497, 246, 307/254; 330/253; 302/572

[56] References Cited

U.S. PATENT DOCUMENTS

| | | | |
|---|---|---|---|
| 4,748,346 | 5/1988 | Emori | 307/270 |
| 4,926,065 | 5/1990 | Goy et al. | 307/246 |
| 4,972,517 | 11/1990 | Kondou et al. | 307/270 |
| 5,142,245 | 8/1992 | Barbu | 307/254 |

Primary Examiner—William L. Sikes
Assistant Examiner—Dinh Le
Attorney, Agent, or Firm—Neil A. Smith

[57] ABSTRACT

A driver circuit is to be used with an attachment unit interface in a network system and receives complementary data signals and an enable signal from constant current source and a differential transistor pair which includes a pair of differential transistors and a pair of load resistors. Each of the differential transistors has a gate terminal which receives one of the complementary data signals, a drain terminal which is connected to one of the load resistors, and a source terminal which is connected to the constant current source. A switch network is connected to the drain terminal of the differential transistors and is activated by the enable signal so as to generate a differential voltage output. Each of a pair of source followers has a gate terminal connected to the switch network and a source terminal The source followers receive the differential voltage output from the switch network. A switching transistor has a gate terminal which receives the enable signal, and source and drain terminals which are connected to the source terminal of a respective one of the source followers and which are further connected to a respective external pull-down load resistor. The source and drain terminals of the switching transistor are to be connected to the attachment unit interface.

7 Claims, 2 Drawing Sheets

DRIVER CIRCUIT FOR AN ATTACHMENT UNIT INTERFACE USED IN A NETWORK SYSTEM

BACKGROUND OF THE INVENTION

1. Field of the Invention

The invention relates to a driver circuit, more particularly to a driver circuit for an attachment unit interface used in a network system.

2. Description of the Related Art

In IEEE 802.3 Ethernet applications, a data terminal equipment (DTE) (1) is connected to a media attachment unit (MAU) (5) through an attachment unit interface (AUI) (3), as best illustrated in FIG. 1 The AUI (3) carries encoded control and data signals between the physical layer signaling sub-layer of the DTE (1) and the physical medium attachment sub-layer of the MAU (5) and provides for duplex encoded data and control signal transmission. The AUI (3) often serves as a drop cable between the DTE (1) and the transceiver on the Ethernet tap. All signals in the AUI cable are differential. The AUI signals are driven by conventional differential drivers capable of driving the specified 78 Ω cable. A detailed description of the electrical characteristics of the AUI signals can be found in the IEEE 802.3 specification. The major characteristics of the AUI signals are summarized briefly in FIGS. 2 and 3. FIG. 2 is a graph which illustrates the amplitude requirement of the transmitted signals in the AUI cable. The maximum rise and fall times is 5 nsec, and the maximum signal overshoot is V1. The ringing of the signals is limited between V2 and V3.

FIG. 3 is a graph illustrating the signal requirement for the AUI driver when the driver ends its active state and enters into its idle state. The AUI driver should be able to maintain a high level output for at least 2 bit times (one bit time is 100 nsec) after the last low-to-high signal transition. The AUI driver should then transit to its idle state with a maximum 40 mV offset voltage within 80 bit times. The undershoot during the transition to the idle state, if any, should be less than 100 mV.

The conventional differential driver circuits that are used to drive the AUI signals are usually implemented in emitter coupled logic (ECL) circuitry. Some of the drawbacks of conventional ECL drivers include difficulty in providing a low idle offset output voltage and the generation of a relatively large undershoot during the active-to-idle transition especially when an inductive load, such as the AUI cable, is driven. Furthermore, conventional ECL drivers are complicated and suffer from large power consumption.

SUMMARY OF THE INVENTION

The main objective of the present invention is to provide a driver circuit for an attachment unit interface used in a network system, which driver circuit is capable of driving a heavy inductive load while ensuring that the undershoot will be kept at a minimum.

Another objective of the present invention is to provide a driver circuit which is capable of driving a heavy inductive load while maintaining a zero intrinsic offset voltage.

Still another objective of the present invention is to provide a driver circuit which can be implemented in CMOS technology so as to attain a significantly lower power consumption when compared to the conventional driver circuits.

Accordingly, the driver circuit of the present invention is to be used with an attachment unit interface in a network system and receives complementary data signals and an enable signal from the network system. The driver circuit comprises:

a constant current source;

a differential transistor pair including a pair of differential transistors and a pair of load resistors, each of the differential transistors having a gate terminal which receives one of the complementary data signals, a drain terminal which is connected to one of the load resistors, and a source terminal which is connected to the constant current source;

a switch network connected to the drain terminal of the differential transistors and activated by the enable signal so as to generate a differential voltage output;

a pair of source followers, each having a gate terminal connected to the switch network and a source terminal, said source followers receiving the differential voltage output from the switch network; and a switching transistor having a gate terminal which receives the enable signal, and source and drain terminals which are connected to the source terminal of a respective one of the source followers and which are further connected to a respective external pull-down load resistor, said source and drain terminals of the switching transistor to be connected to the attachment unit interface.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

In order to meet the AUI signal requirements, the driver circuit of the present invention uses active devices to clamp the differential output voltage during the active-to-idle state transition. Thus, the undershoot requirement can be met even when a heavy inductive load is in use.

Figure 1:
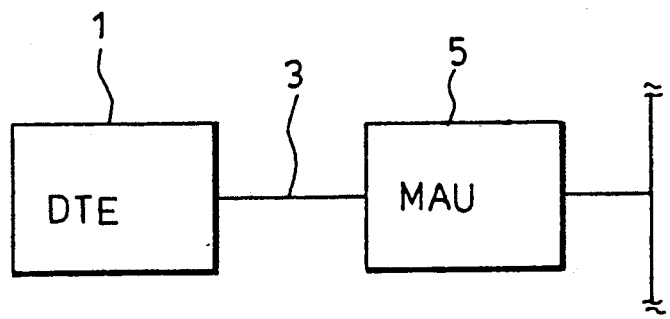
FIG. 1 is a block diagram illustrating the use of an attachment unit interface (AUI) to interconnect a data terminal equipment (DTE) and a media attachment unit in a network system.
Figure 2:
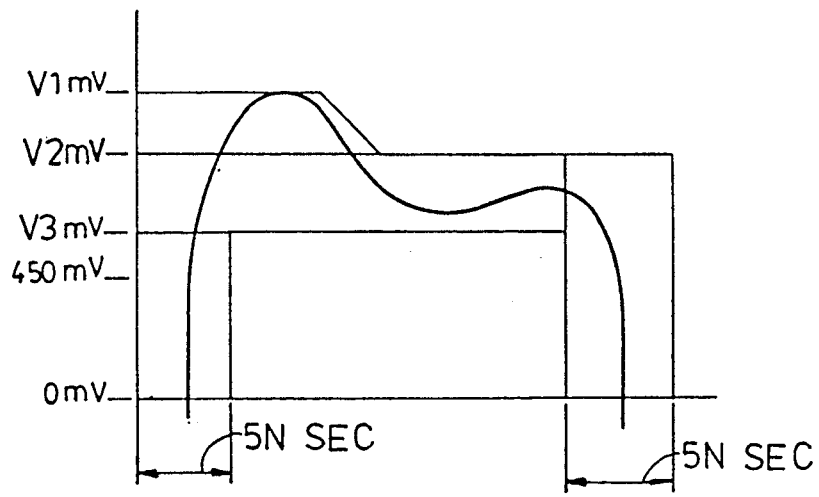
FIG. 2 is a graph which illustrates the amplitude requirement of transmitted AUI signals in an AUI cable.
Figure 3:
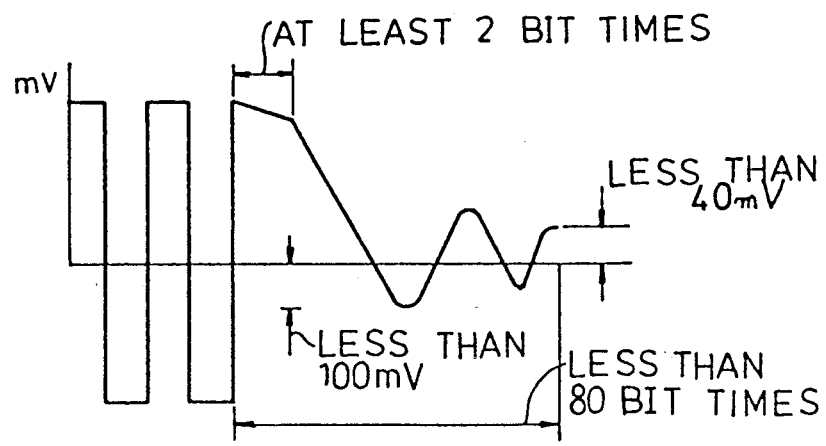
FIG. 3 is a graph illustrating the signal requirement for an AUI driver when the driver ends its active state and enters into its idle state.
Figure 4A:
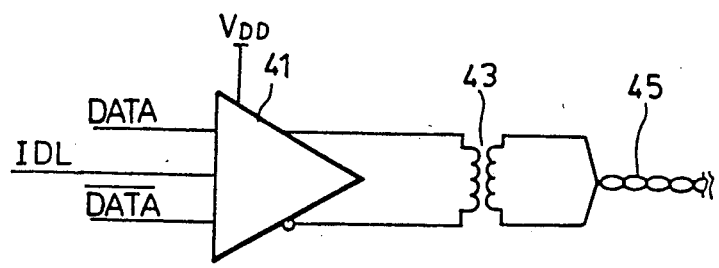
FIG. 4A is a schematic circuit diagram illustrating how the preferred embodiment of a driver circuit according to the present invention is connected to an AUI port so as to drive the AUI cable.
Figure 4B:
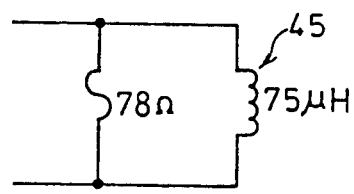
FIG. 4B is a schematic circuit diagram illustrating the equivalent load to the driver circuit of the present invention.

Referring to FIG. 4A, the driver circuit (41) of the present invention is connected to the AUI port via a pulse transformer (43) in order to drive an AUI cable (45). The AUI cable (45) has a typical characteristic impedance of 78 ohms and is properly terminated. FIG.

4B illustrates the equivalent load to the driver circuit (41).

The driver circuit (41) receives complementary data signals from a network data encoder (not shown) and an enable signal (IDL). When the enable signal (IDL) is low, the driver circuit (41) is enabled. Otherwise, the driver circuit (41) is in the idle state and the amplitude of the differential voltage output of the driver circuit (41) approaches zero. During the transition of the enable signal (IDL), the driver circuit (41) produces an output waveform which corresponds with the undershoot requirement.

Figure 5:
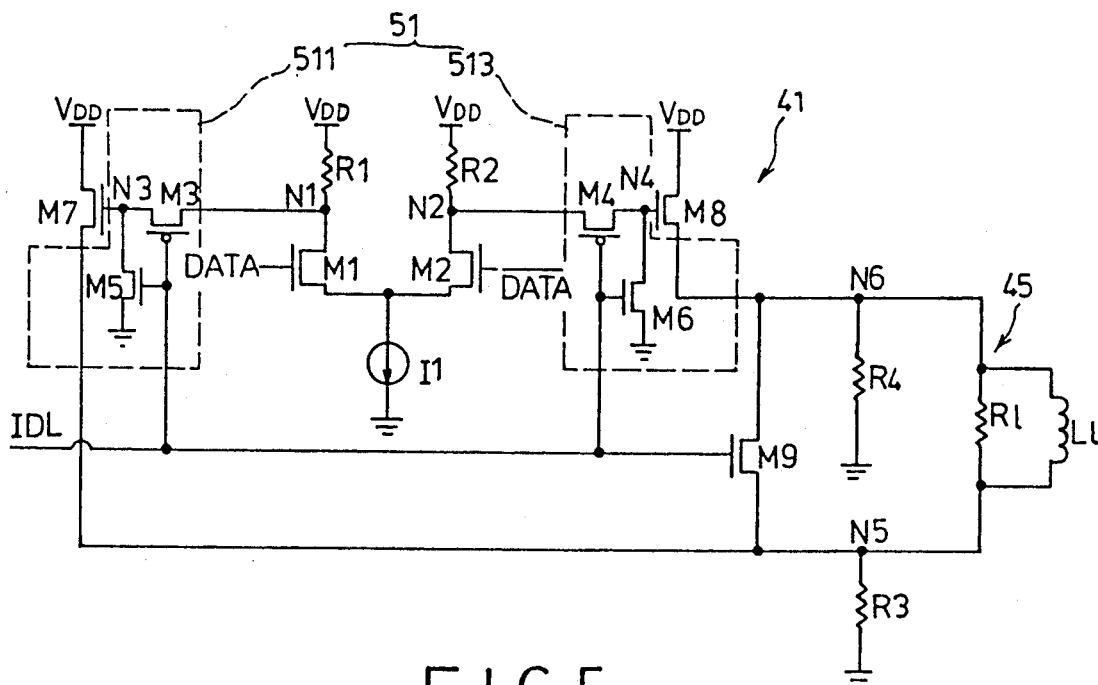
FIG. 5 is a schematic electrical circuit diagram of the preferred embodiment.

FIG. 5 is a schematic electrical circuit diagram of the driver circuit (41). The driver circuit (41) comprises a constant current source (I1), a differential transistor pair including a pair of differential transistors (M1, M2) and a pair of load resistors (R1, R2), a switch network (51), two source followers (M7, M8) and a switching transistor (M9) connected to two external pull-down load resistors (R3, R4).

Each of the differential transistors (M1, M2) has a gate terminal which receives one of the complementary data signals from the network data encoder, a drain terminal which is connected to one of the load resistors (R1, R2), and a source terminal which is connected to the constant current source (I1). The switch network (51) is connected to the drain terminal of the differential transistors (M1, M2) and is activated by the enable signal (IDL) so as to generate a differential voltage output.

The switch network (51) includes first and second switch sets (511, 513). Each of the first and second switch sets (511, 513) interconnects one of the differential transistors (M1, M2) and one of the source followers (M7, M8). The first switch set (511) includes a first transistor (M3) having a gate terminal which receives the enable signal (IDL), and source and drain terminals which are connected respectively to the drain terminal of one of the differential transistors (M1) and to the gate terminal of one of the source followers (M7). The first switch set (511) further includes a second transistor (M5) having a gate terminal which receives the enable signal (IDL) and a drain terminal which is connected to the gate terminal of one of the source followers (M7). The second switch set (513) includes a third transistor (M4) having a gate terminal which receives the enable signal (IDL), and source and drain terminals which are connected respectively to the drain terminal of the other differential transistor (M2) and to the gate terminal of the other source follower (M8). The second switch set (513) further includes a fourth transistor (M6) having a gate terminal which receives the enable signal (IDL) and a drain terminal which is connected to the gate terminal of the other source follower (M8).

Each of the source followers (M7, M8) has a gate terminal connected to the switch network (51) and a source terminal. The switching transistor (M9) has a gate terminal which receives the enable signal (IDL), and source and drain terminals which are connected to the source terminal of a respective one of the source followers (M7, M8) and which are further connected to a respective one of the external pull-down load resistors (R3, R4). The source and drain terminals of the switching transistor (M9) are to be connected to the AUI cable (45).

In order to facilitate explanation of the operation of the driver circuit (41), six nodes (N1, N2, N3, N4, N5) have been labeled in FIG. 5.

The differential transistors (M1, M2) switch the current source (I1) between the load resistors (R1, R2). The first and second switch sets (511, 513) derive the differential voltage output from the differential transistors (M1, M2) and provide the same to the source followers (M7, M8). The switching transistor (M9) functions as a switch that is controlled by the enable signal (IDL) so as to short the output nodes (N5, N6) of the driver circuit (41). In actual practice, the switching transistor (M9) has an impedance which is less than a load impedance due to the AUI cable (45) when the switching transistor (M9) is turned on by the enable signal (IDL). The resistor (R1) and the inductor (L1) act as the equivalent load of the AUI cable (45).

Assuming that the enable signal (IDL) is high, the driver circuit (41) is disabled. The first and third transistors (M3, M4) are turned off, the second and fourth transistors (M5, M6) are turned on, while the switching transistor (M9) is turned on. Because the second and fourth transistors (M5, M6) are turned on, the nodes (N3, N4) are at a low logic state, thereby shutting off the source followers (M7, M8). The nodes (N5, N6) are also pulled to a low logic state by the resistors (R3, R4). Note that the resistors (R3, R4) do not consume DC power at this stage. The offset voltage output of the driver circuit (41) is the difference in the potentials across the nodes (N5, N6). Because there is no active element which drives these two nodes (N5, N6), and because there is no current flowing through the resistors (R3, R4), the offset voltage output is intrinsically zero. In addition, the switching transistor (M9), which is turned on by the enable signal (IDL), serves as an additional low resistance path that is provided between the nodes (N5, N6).

Assuming that the enable signal (IDL) is low, the driver circuit (41) is enabled. The first and third transistors (M3, M4) are turned on, the second and fourth transistors (M5, M6) are turned off, while the switching transistor (M9) is turned off. The complementary DATA and /DATA signals from the network data encoder (not shown) are applied to the differential transistors (M1, M2). The current source (I1) is switched by the differential transistors (M1, M2) to flow between the load resistors (R1, R2). The voltage swing at node (N1) is from Vdd to Vdd−I1*R1, while that at node (N2) is from Vdd to Vdd−I1*R2. The voltages at nodes (N1, N2) are received by the source followers (M7, M8) via the first and third transistors (M3, M4). Thus, the voltage levels at the output nodes (N5, N6) are:

$$V(\text{HIGH}) = Vdd - Vtn(M7, M8)$$

$$V(\text{LOW}) = Vdd - I1 * R(R1, R2) - Vtn(M7, M8)$$

wherein Vtn(M7, M8) is the threshold voltage of the source followers (M7, M8), and the voltages across the first and third transistors (M3, M4) are negligible. The DC bias current to the source followers (M7, M8) is provided by the external load resistors (R3, R4).

Assuming that active-to-idle transition of the driver circuit (41) has yet to occur and that the input data (DATA) is maintained at a high logic state, the differential transistor (M1) is turned on, while the differential transistor (M2) is turned off. Current flows through the resistor (R1). The potential at node (N3) is Vdd−I*R1, while that at node (N4) is Vdd. When the enable signal (IDL) changes from a low logic state to a high logic state, the switching transistor (M9) is turned on, thereby shorting the nodes (N5, N6). Any overshoot caused by inductance current is shorted by the switching transistor (M9). At the same time, the first and third transistors (M3, M4) are immediately turned off, while the second and fourth transistors (M5, M6) are turned on. The second and fourth transistors (M5, M6) serve as a discharge path for the source followers (M7, M8) when turned on by the enable signal (IDL) so as to decrease gradually the potential at the nodes (N3, N4). Thus, the differential voltage output approaches zero as the potential at the nodes (N3, N4) approach the low logic level. At the same time, nodes (N5, N6) are discharged to the low logic level by the external resistors (R3, R4). The impedance of the switching transistor (M9) becomes much less than that of the load impedance due to the AUI cable (45) to further reduce any overshoot due to the reverse current of the inductive load.

In this embodiment, the transistors (M3, M4, M5, M6) have discharge times of 2 to 3 bit times (1 bit time = 100 nsec). A shorter discharge time would create difficulties in controlling the maximum undershoot, while a longer discharge time would require a thicker transistor configuration.

The advantages and characterizing features of the driver circuit of the present invention are as follows:

1. The driver circuit is capable of driving a heavy inductive load while ensuring that the undershoot will be kept at a minimum and that a zero intrinsic offset voltage will be maintained.

2. The driver circuit has a significantly lower power consumption when compared to the prior art.

3. The transistors (M1-M9) of the driver circuit are CMOS transistors. Thus, a lower power consumption can be ensured.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A driver circuit for an attachment unit interface used in a network system, said network system providing complementary data signals and an enable signal to said driver circuit, the driver circuit comprising:

a constant current source;

a differential transistor pair including a pair of differential transistors and a pair of load resistors, each of said differential transistors having a gate terminal which receives one of said complementary data signals, a drain terminal which is connected to one of said load resistors, and a source terminal which is connected to said constant current source;

a switch network connected to said drain terminal of said differential transistors and activated by said enable signal so as to generate a differential voltage output;

a pair of source followers, each having a gate terminal connected to said switch network and a source terminal, said source followers receiving said differential voltage output from said switch network; and a switching transistor having a gate terminal which receives said enable signal, and source and drain terminals which are connected to said source terminal of a respective one of said source followers and which are further connected to a respective external pull-down load resistor, said source and drain terminals of said switching transistor to be connected to said attachment unit interface.

2. The driver circuit as claimed in claim 1, wherein said switch network comprises first and second switch sets, each of said first and second switch sets interconnecting one of said differential transistors and one of said source followers, at least one of said first and second switch sets including:

a first transistor having a gate terminal which receives said enable signal, and source and drain terminals which are connected respectively to said drain terminal of said one of said differential transistors and to said gate terminal of said one of said source followers; and a second transistor having a gate terminal which receives said enable signal and a drain terminal which is connected to said gate terminal of said one of said source followers, said second transistor serving as a discharge path for said one of said source followers when turned on by said enable signal so as to decrease gradually said differential voltage output to zero.

3. The driver circuit as claimed in claim 1, wherein said switching transistor has an impedance which is less than a load impedance due to said attachment unit interface when said switching transistor is turned on by said enable signal.

4. The driver circuit as claimed in claim 2, wherein at least one of said first and second transistors has a discharge time of 2 to 3 bit times.

5. The driver circuit as claimed in claim 4, wherein one bit time is 100 nsec.

6. The driver circuit as claimed in claim 1, wherein all of said differential transistors, said source followers and said switching transistor are CMOS transistors.

7. The driver circuit as claimed in claim 2, wherein said first and second transistors are CMOS transistors.

* * * * *